United States Patent
Shaw et al.

(10) Patent No.: US 9,241,400 B2
(45) Date of Patent: Jan. 19, 2016

(54) WINDOWED REFERENCE PLANES FOR EMBEDDED CONDUCTORS

(71) Applicant: Seagate Technology LLC, Cupertino, CA (US)

(72) Inventors: John Wayne Shaw, Frederick, CO (US); Jacob Charles Matousek, Firestone, CO (US); Todd Michael Lammers, Lafayette, CO (US)

(73) Assignee: Seagate Technology LLC, Cupertino, CA (US)

( * ) Notice: Subject to any disclaimer, the term of this patent is extended or adjusted under 35 U.S.C. 154(b) by 196 days.

(21) Appl. No.: 13/974,569

(22) Filed: Aug. 23, 2013

(65) Prior Publication Data

US 2015/0055307 A1     Feb. 26, 2015

(51) Int. Cl.
*H05K 1/02*     (2006.01)

(52) U.S. Cl.
CPC ............ *H05K 1/0253* (2013.01); *H05K 1/0224* (2013.01); *H05K 2201/0723* (2013.01); *H05K 2201/09236* (2013.01); *H05K 2201/09681* (2013.01)

(58) Field of Classification Search
CPC . H05K 1/0224; H05K 1/0227; H05K 1/0253; H05K 1/0245
See application file for complete search history.

(56) References Cited

U.S. PATENT DOCUMENTS

| | | | |
|---|---|---|---|
| 5,287,478 A * | 2/1994 | Johnston et al. | 711/111 |
| 5,300,899 A * | 4/1994 | Suski | 333/1 |
| 5,479,138 A * | 12/1995 | Kuroda et al. | 333/1 |
| 5,661,848 A * | 8/1997 | Bonke et al. | 711/112 |
| 5,675,299 A * | 10/1997 | Suski | 333/1 |
| 6,184,478 B1 * | 2/2001 | Imano et al. | 174/261 |
| 6,219,255 B1 | 4/2001 | Teshome | |
| 6,235,993 B1 * | 5/2001 | Johnston et al. | 174/117 FF |
| 6,278,345 B1 * | 8/2001 | Dai | 333/238 |
| 6,348,722 B1 * | 2/2002 | Yoshikoshi | 257/508 |
| 6,590,466 B2 * | 7/2003 | Lin et al. | 333/1 |
| 6,608,259 B1 | 8/2003 | Norskov | |
| 6,624,729 B2 * | 9/2003 | Wright et al. | 333/238 |
| 6,843,660 B2 * | 1/2005 | Barr et al. | 439/67 |
| 6,943,749 B2 | 9/2005 | Paun | |
| 6,969,807 B1 * | 11/2005 | Lin et al. | 174/117 F |
| 7,015,772 B2 * | 3/2006 | Ji | 333/128 |
| 7,102,456 B2 * | 9/2006 | Berg | 333/4 |
| 7,196,273 B2 * | 3/2007 | Tanaka et al. | 174/117 R |
| 7,202,758 B2 * | 4/2007 | Hsu | 333/33 |
| 7,292,452 B2 * | 11/2007 | Ng et al. | 361/780 |
| 7,355,554 B2 * | 4/2008 | Boisbouvier et al. | 343/767 |
| 7,501,583 B2 | 3/2009 | Chao et al. | |

(Continued)

FOREIGN PATENT DOCUMENTS

| | | |
|---|---|---|
| EP | 1376747 A3 | 7/2005 |
| JP | 07-307578 | 11/1995 |
| WO | 2007/146665 A2 | 12/2007 |

*Primary Examiner* — Jeremy C Norris
*Assistant Examiner* — Nathan Milakovich
(74) *Attorney, Agent, or Firm* — Hall Estill Attorneys at Law

(57) ABSTRACT

A rigid multi-layer printed circuit board (PCB) has an embedded elongated conductor between opposing first and second reference planes. The first and second reference planes are formed of conductive material and are electrically isolated from the conductor by intervening insulative material. Each of the first and second reference planes have a plurality of spaced apart windows extending therethrough, the windows aligned with the elongated conductor.

20 Claims, 4 Drawing Sheets

(56) References Cited

U.S. PATENT DOCUMENTS

| | | | |
|---|---|---|---|
| 7,501,928 B2 | 3/2009 | Shoji | |
| 7,504,904 B1 * | 3/2009 | Powers et al. | 333/1 |
| 7,504,957 B2 | 3/2009 | Veerasamy | |
| 7,521,360 B2 | 4/2009 | Halahan et al. | |
| 7,642,878 B2 * | 1/2010 | Park et al. | 333/1 |
| 7,655,870 B2 * | 2/2010 | Chang et al. | 174/255 |
| 7,804,028 B2 * | 9/2010 | Chin et al. | 174/117 R |
| 7,872,605 B2 | 1/2011 | Baliarda et al. | |
| 7,952,195 B2 | 5/2011 | Haba | |
| 8,040,200 B2 | 10/2011 | Minegishi et al. | |
| 8,058,954 B2 | 11/2011 | Yeates | |
| 8,076,585 B2 * | 12/2011 | Lin | 174/250 |
| 8,106,729 B2 * | 1/2012 | Tzuang et al. | 333/238 |
| 8,115,568 B2 | 2/2012 | Hsu | |
| 8,120,441 B2 | 2/2012 | Hsu et al. | |
| 8,130,471 B1 * | 3/2012 | German et al. | 360/245.9 |
| 8,179,334 B2 * | 5/2012 | Pathak et al. | 343/829 |
| 8,324,979 B2 * | 12/2012 | Cho | 333/4 |
| 8,390,401 B2 * | 3/2013 | Pruvost et al. | 333/238 |
| 8,436,785 B1 | 5/2013 | Lai et al. | |
| 8,587,953 B2 * | 11/2013 | Brock et al. | 361/755 |
| 8,680,403 B2 * | 3/2014 | Howard et al. | 174/261 |
| 8,711,069 B2 * | 4/2014 | Park et al. | 345/87 |
| 8,922,291 B2 * | 12/2014 | Xie et al. | 333/4 |
| 8,941,012 B2 * | 1/2015 | Pai | 174/254 |
| 2009/0079523 A1 | 3/2009 | Hsu | |
| 2011/0139489 A1 | 6/2011 | Yoon et al. | |
| 2012/0048599 A1 * | 3/2012 | Lin | 174/255 |
| 2013/0057857 A1 | 3/2013 | Jamshidi et al. | |
| 2013/0093532 A1 | 4/2013 | Watanabe et al. | |
| 2013/0162364 A1 * | 6/2013 | Lin | 333/5 |

* cited by examiner

WINDOWED REFERENCE PLANES FOR EMBEDDED CONDUCTORS

SUMMARY

Various embodiments of the present disclosure are generally directed to the use of windowed reference planes in a printed circuit board.

In accordance with some embodiments, a rigid multi-layer printed circuit board (PCB) has an embedded elongated conductor between opposing first and second reference planes. The first and second reference planes are formed of conductive material and are electrically isolated from the conductor by intervening insulative material. Each of the first and second reference planes have a plurality of spaced apart windows extending therethrough, the windows aligned with the elongated conductor.

These and other features and aspects which characterize various embodiments of the present invention can be understood in view of the following detailed discussion and the accompanying drawings.

DETAILED DESCRIPTION

Figure 1:
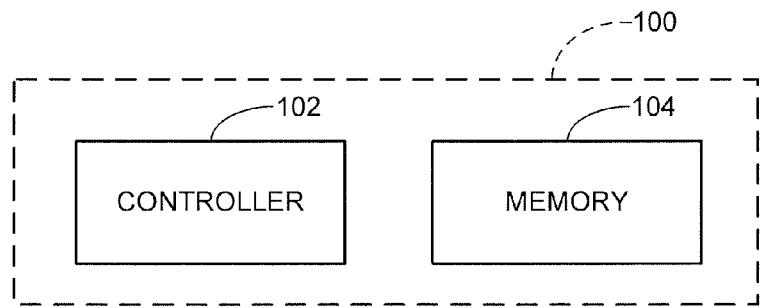
FIG. 1 is a functional representation of a data storage device.

Printed circuit board assemblies (PCBAs) are often used to provide electrical circuitry for various devices. PCBAs often include a multi-layer rigid substrate (a "printed circuit board," or "PCB") with insulative and conductive layers, signal traces, electrical connection pads, etc. One or more electrical components can be affixed to the PCB to form the final PCBA.

PCBA designers may take a number of factors in consideration when designing a PCBA including performance, cost, dimensions, electromagnetic interference (EMI) generation and susceptibility, transient effects, electrostatic discharge (ESD) protection, and so on.

Data storage devices, such as hard disc drives (HDDs), solid-state drives (SSDs), hybrid drives, etc. often include a storage media section and a controller section. An HDD, for example, may include a sealed housing that encloses one or more rotatable magnetic data storage media (discs) to provide the storage media section. An externally mounted PCBA may be affixed to the housing to support various control and interface circuits of the controller section.

New generation control interfaces, such as SATA/SAS (serial ATA/serial SCSI) and Ethernet provide higher levels of data rate I/O transfer performance, but can provide challenges particularly in the areas of emissions, impedance control and environmental susceptibility. One way such challenges have been addressed in the past is through dedicated routing of conductors on the PCB relative to adjacent components, and the use of additional reference (e.g., grounding, shielding) planes within a multi-layer PCB structure. While operable, these and other actions can adversely increase costs, dimensions, and susceptibility of the PCBA to environmental factors. For example, routing sensitive conductive paths on an exterior surface of a PCB can improve impedance performance, but at the risk of increased environmental EMI sensitivity (as well as physical damage).

Accordingly, various embodiments of the present disclosure are generally directed to an apparatus that addresses these and other issues. As explained below, a printed circuit board (PCB) can be provided with at least one conductive path embedded within the PCB between opposing reference planes. The reference planes are provisioned with a plurality of openings (windows) that extend through the reference plane and are aligned with the embedded conductive path. A long axis of the windows may be aligned in the direction of the conductive path.

In some embodiments, the embedded conductive path comprises a pair of adjacent and parallel conductors along which a differential signal is transmitted, and the planes comprise electrically conductive planes at a reference voltage, such as nominally zero volts (ground). In further embodiments, the PCB forms a support substrate for a data storage device PCBA having a high speed interface, such as a SATA/SAS interface, and the differential conductors transmit data I/O signals over such interface.

By windowing the ground planes adjacent to the interface routing conductors, capacitive coupling can be reduced sufficiently to attain target conductor impedance values (e.g., 100 ohms, etc.). Sufficient shielding will be present in the non-windowed portions of the plane(s) to reduce transmission of, and susceptibility from, electromagnetic interference (EMI). A geometry of the windowing can be used to define the environmental sensitivity, and allows conductor (trace) width and spacing adjustments in order to meet impedance control and common mode rejection requirements.

These and other features of various embodiments can be understood beginning with a review of FIG. 1 which provides a functional block representation of a data storage device 100. The device 100 includes a controller 102 and a memory 104. The controller 102 can take a variety of forms such as a hardware based control circuit or a general purpose programmable processor having suitable programming to provide top level control for the device. The memory 104 can take a variety of forms such as rotatable magnetic or optical data recording media (discs), solid-state flash memory, hybrid memory modules (e.g., both rotatable and solid-state), etc.

Figure 2:
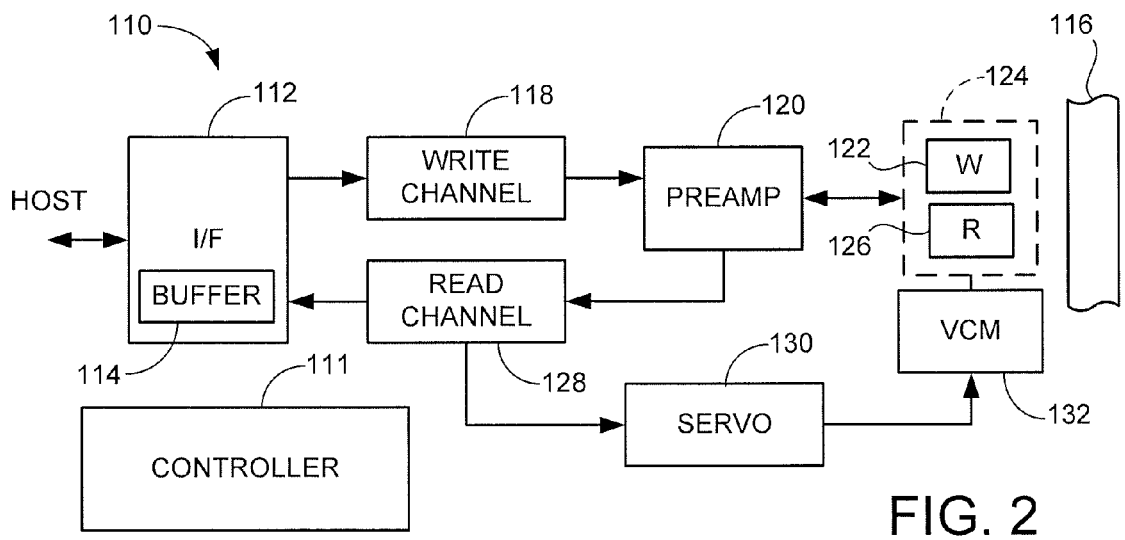
FIG. 2 is a functional representation of another data storage device.

FIG. 2 is a functional block diagram for a data storage device 110 that may correspond to the device 100 of FIG. 1 in accordance with some embodiments. The data storage device 110 is characterized for purposes of the present disclosure as a hard disc drive (HDD) that employs magnetic recording to store data from a host device (not separately shown). The HDD may use a variety of recording technologies such as but not limited to heat assisted magnetic recording (HAMR), perpendicular recording, bit patterned media, etc. Such are merely exemplary and are not limiting.

The device 110 in FIG. 2 includes a top level controller 111 that may be realized in hardware or firmware. An interface circuit (I/F) 112 communicates with the host device and includes a data buffer 114 to temporarily store data pending transfer between the host device and a rotatable perpendicular data recording medium 116.

A write channel 118 operates to encode input write data from the host to provide a serialized data stream to a preamplifier/driver (preamp) 120. The preamp 120 provides a sequence of write currents to a perpendicular magnetic write element (W) 122 of a data transducer 124 to write data to the medium 116.

During a readback operation, readback signals are transduced by a magneto-resistive (MR) read element (R) 126 of the data transducer 124. The transduced signals are supplied to the preamp 120. The preamp 120 conditions and amplifies the readback signals and provides the same to a read channel 128. The read channel 128 applies signal processing techniques to recover the originally stored data to the buffer 114 pending subsequent transfer to the host.

During both read and write operations, specially configured servo positioning data provided to the medium 116 are transduced by the read element 126 and, after demodulation by a portion of the read channel 128, are supplied to a servo control circuit 130. The servo control circuit 130 provides positional control signals to a voice coil motor (VCM) 132 coupled to the data transducer 124 to position the respective write and read elements 122, 126 adjacent various data tracks defined on the medium 116.

Figure 3:
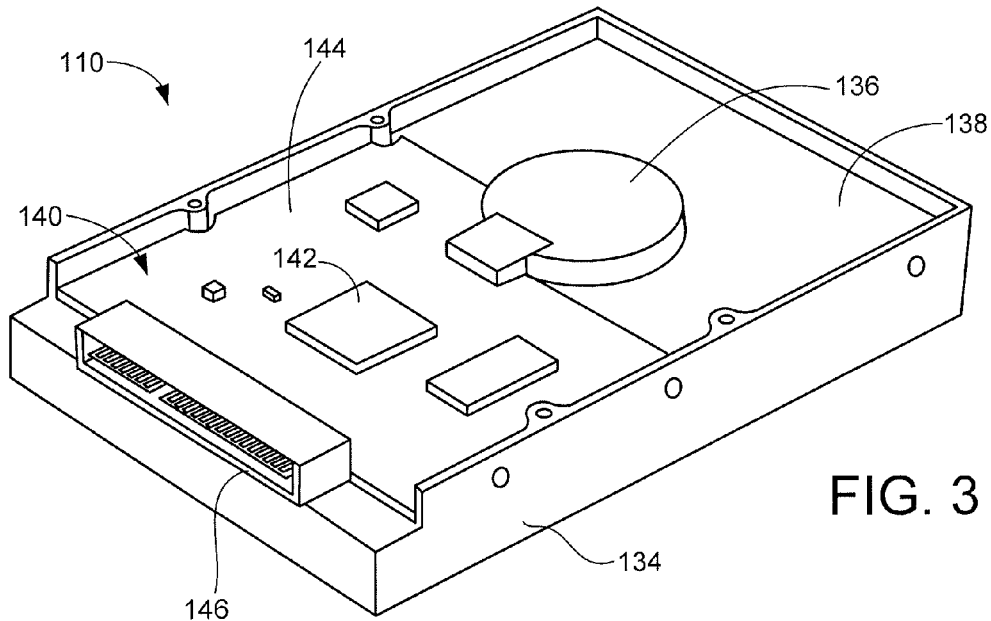
FIG. 3 is a perspective view of the data storage device of FIG. 2 in accordance with some embodiments.

FIG. 3 is a perspective underside representation of the device 110 of FIG. 2 in accordance with some embodiments. A housing 134 encloses various aspects of the device 110 such as the media 116, preamp 120, heads 124, VCM 132, etc. A boss projection 136 extends from a lower surface 138 of the housing 134 to accommodate the aforementioned spindle motor used to rotate the media 116.

A rigid printed circuit board assembly (PCBA) 140 is affixed to the lower surface 138 of the housing 134 as shown. The PCBA 140 incorporates various aspects of the device 110 such as the controller 110, I/F 112, buffer 114, read and write channels 118, 128, servo circuit 130, etc. These and other circuits are represented by various components 142 which are affixed to a rigid, multi-layer substrate 144 (also referred to as a "printed circuit board," or "PCB").

An interface connector 146 enables interconnection of the device 110 with a host (not separately shown). The connector 146 is shown to represent a SATA/SAS connector, but such is merely exemplary. It will be appreciated that other forms and styles of PCBs can readily be used apart from a data storage device environment.

Figure 4:
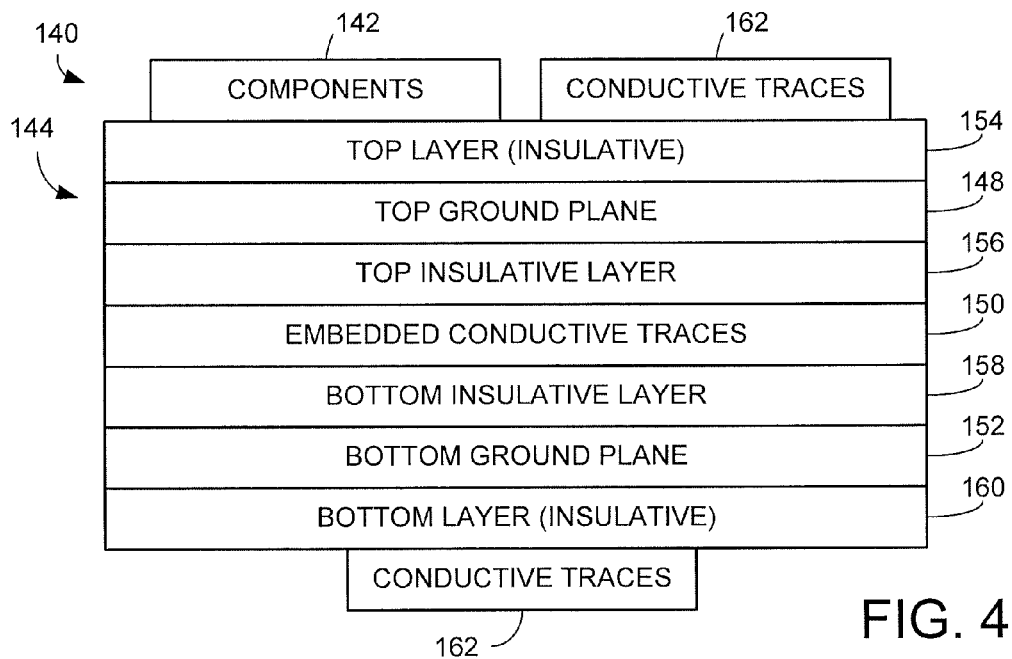
FIG. 4 is a schematic representation of the printed circuit board (PCB) of FIG. 3 in accordance with some embodiments.

FIG. 4 is a schematic representation of the PCBA 140 in accordance with some embodiments. Other structures can be used. The PCB 144 is a multi-layer structure that includes 7 layers as an example. The PCB 144 includes a plurality of conductive layers: a top ground plane 148, embedded conductive traces 150, and a bottom ground plane 152. Further the PCB includes a plurality of insulative layers: a top layer 154, a top insulative layer 156, a bottom insulative layer 158, and a bottom layer 160. Further, conductive traces 162 and components 142 may be disposed on the PCB 144. The conductive traces 162 may act as power and signal supply for the device. As mentioned above, the components 142 may include the controller 110, I/F 112, buffer 114, read and write channels 118, 128, servo circuit 130, etc. The conductive traces 162 and the components 142 may be disposed on the top layer 154, the bottom layer 160, or both.

Each of the conductive layers is disposed between a pair of insulative layers, such that no two conductive layers are contactingly adjacent and each of the conductive layers is substantially electrically isolated from each of the other conductive layers by intervening insulative material. More specifically, the top ground plane 148 is disposed between the top layer 154 and the top insulative layer 156. The embedded conductive traces 150 are disposed between the top insulative layer 156 and the bottom insulative layer 158. The bottom ground plane 152 is disposed between the bottom insulative layer 158 and the bottom layer 160.

The conductive layers can be made of metals, such as gold, copper, etc. or other conductive materials. The conductive layers include a layer of embedded conductive traces 150 that can be used for power and signal supply in the device. The layer of embedded conductive traces 150 is disposed between the first ground plane 148 and the second ground plane 152. The ground planes 148, 152 are electrically conductive surfaces that are connected to electrical ground, nominally 0 volts. The planes may alternatively be characterized as supply planes providing a non-zero voltage.

The insulative layers can be made of fiberglass, plastic, resin impregnated B-stage cloth (also known as pre-preg), etc. The insulative layers provide electrical isolation between the conducting layers of the PCB 144. Dielectric material may be used in the PCB 144, as needed. Other layers in the PCB 144 are possible.

Figure 5:
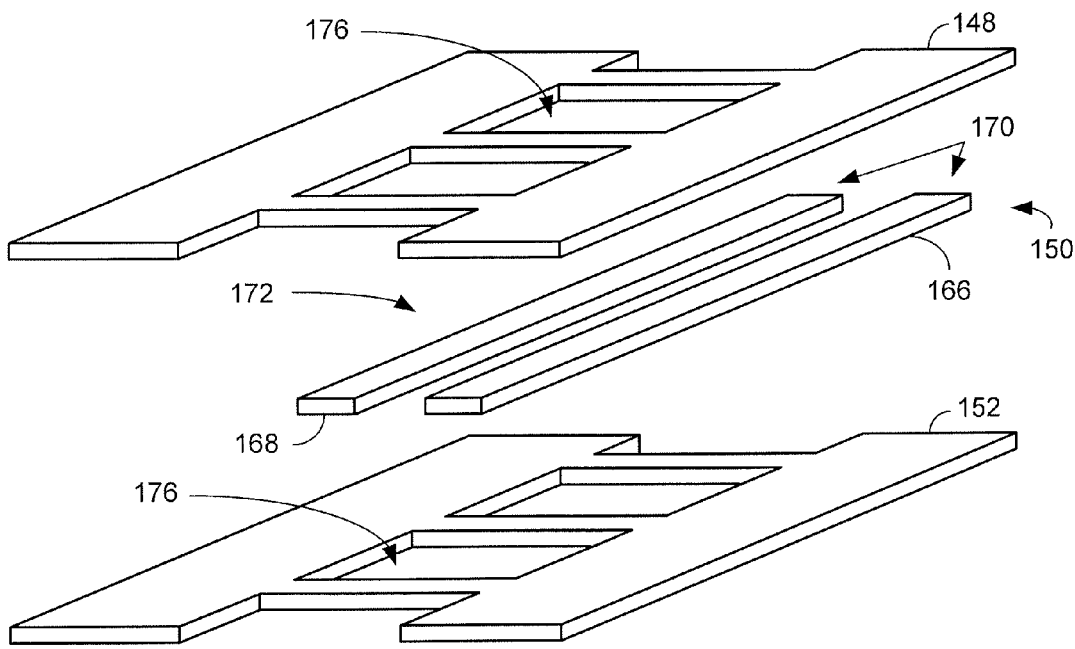
FIG. 5 is an exploded isometric representation of selected layers from the PCB of FIG. 4 including embedded differential signal conductors and opposing ground planes.

FIG. 5 is an exploded representation of the embedded conductive traces 150 and ground planes 148, 152 from FIG. 4. Insulative material, or layers, has been omitted for clarity.

The layer of embedded conductive traces 150 is shown to have a first conductive trace 166 and a second conductive trace 168 disposed in a pair of conductive traces 170. The pair of conductive traces 170 are adjacent and substantially parallel, and the first conductive trace 166 and the second conductive trace 168 may be matched for amplitude characteristics and phase characteristics. The pair of conductive traces 170 can be used as an embedded elongated conductor (or simply elongated conductor) 172. The pair of conductive traces 170 can provide differential pair routing for differential signal transmission in the device. Greater or fewer conductive traces than two may be used, if needed. For example, the embedded elongated conductor 172 may consist of one conductive trace or constitute more than two conductive traces.

The signals transmitted can include SATA, SAS, and Ethernet signals, or any other signals that may need impedance tuning and environmental susceptibilities addressed. The embedded conductive traces 150 are disposed between the top and bottom ground planes 148, 152 in order to minimize environmental sensitivities (i.e., electrostatic discharge susceptibility and electromagnetic interference) and for impedance tending.

The top ground plane 148 is shown to have a plurality of windows 176. Similarly, the bottom ground plane 152 has a plurality of windows 176. The elongated conductor 172 necessitates specific impedance control to maintain signal integrity while minimizing environmental sensitivity. Thus, signal integrity design philosophy may inversely impact environmental sensitivity. In order to meet a target differential impedance for the elongated conductor 172, the pair of conductive traces 170 may be separated such that significant common mode rejection occurs. The windows 176 are used to take into consideration both impedance control and environmental sensitivities.

The windows 176 signify an absence of ground plane material in the top ground plane 148 or the bottom ground plane 152. In other words, the windows 176 extend through the full thickness of the top ground plane 148 or the bottom ground plane 152. The windows 176 may be absent any solid material, such as solid dielectric material. Some example solid dielectric materials include porcelain, glass, and plastics. A plurality of windows 176 may be present in the top ground plane 148, the bottom ground plane 152 or both the top and bottom ground planes 148, 152.

The windows 176 are aligned with the pair of conductive traces 166, 168. The pair of conductive traces 170 may be considered to be located within a volume of the windows 176 as might be seen more clearly in later figures. The windows 176 can be adjusted for impedance matching to the target differential impedance for the elongated conductor 172 while still providing environmental sensitivity protection.

By providing the windows 176 in the ground planes 148, 152 immediately adjacent to the elongated conductor 172, capacitive coupling may be reduced significantly so that the target differential impedance in the elongated conductor 172 is achieved. However, by leaving enough material in the ground planes 148, 152 across the elongated conductor 172, the issues related to environmental sensitivities can be minimized.

As can be seen in FIGS. 5-14, the geometry of the windows 176 can be adjusted as needed. It has been found that the geometry and arrangement of the windows 176 determines environmental sensitivity. In addition, the geometry of the windows 176 allows width of the elongated conductor 172 and spacing between the pair of conductive traces 170 to be adjusted. By adjusting the width and spacing of the pair of conductive traces 170, the impedance in the elongated conductor 172 can be controlled to the target differential impedance while common mode rejection requirements can be maintained.

Figure 6:
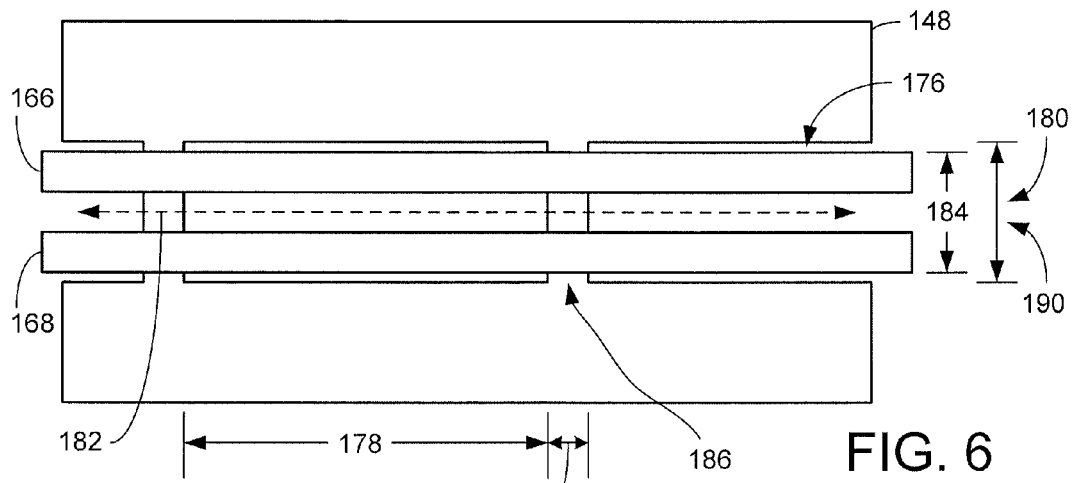
FIG. 6 is a top plan view of FIG. 5.

FIG. 6 is a top plan view of the bottom ground layer 148 and the first and second conductive traces 166, 168. The top ground layer is not shown for clarity. The window 176 is substantially a rectangle in some embodiments. The window 176, when rectangular, has a length 178 and a width 180. The length 178 is substantially parallel to the elongate axis 182 of the elongated conductor 172. The width 180 is substantially orthogonal to the elongate axis 182 of the elongated conductor 172. The dimension of a the length 178 may be greater than the dimension of the width 180.

A width 184 of the elongated conductor 172 is less than the width 180. When the width 184 is less than the width 180, the elongated conductor 172 could be said to lie within the space defined by the width 180.

Each of the plurality of windows 176 may be rectangular shape of substantially the same dimensions of the length 178 and the width 180, or each of the windows 176 may be rectangles of substantially different dimensions of the length 178 and the width 180.

A crossing member 186 of the bottom ground plane 148 has a length 188 and a width 190. By the nature of the width 190 of the crossing number 186 and the width 180 of the window 176, the widths 190 and 180 are substantially equal. On the other hand, the length 188 of the crossing member 186 may be less than, substantially equal to, or greater than the length 178 of the window 176. As shown in FIG. 6, the length 188 is less than the length 178.

As discussed above, adjustments to the dimensions of the windows 176 can be made to attain the target conductor impedance values and to account for environmental susceptibility.

Figure 7:
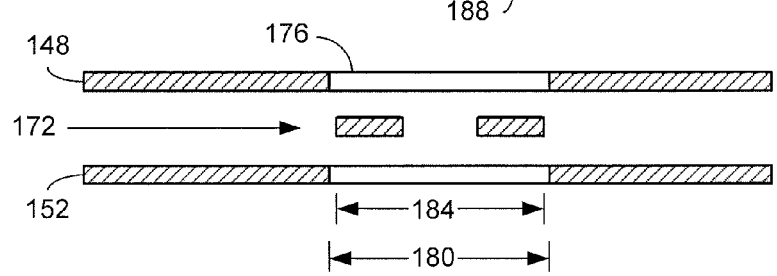
FIG. 7 is an end elevational view of FIG. 6.

FIG. 7 is an end elevational view that shows the differential pair routing disposed between the top ground plate 148 and the bottom ground plate 152. The width 180 of the window 176 can be equal to or greater than the width 184 of the elongated conductor 172, in which case the elongated conductor 172 lies within the space defined by the window 176 in the width dimension. In addition, the elongated conductor 172 may lie within the space defined by the distance between the top ground letter 148 and the bottom ground letter 152, as shown.

As shown, the elongated conductor 172 can be displaced substantially equal distance from the top ground plate 148 and the bottom ground plate 152, however the elongated conductor 172 may be disposed closer to the top ground plate 148 than the bottom ground plate 152 or vice versa. Such adjustments in the relationship of the elongated conductor 172 and the top and bottom ground plates 148, 152 can be used to control the impedance and environmental sensitivities.

Figure 8:
FIG. 8 shows an alternative window arrangement for the layers from FIG. 4.

FIG. 8 is an alternative arrangement of the windows 176 in the ground layers 148, 152 from FIG. 4. The windows 176 are shown as circles, but other curvilinear shapes are possible. Of course, asymmetric shapes may also be chosen for the windows 176.

Figure 9:
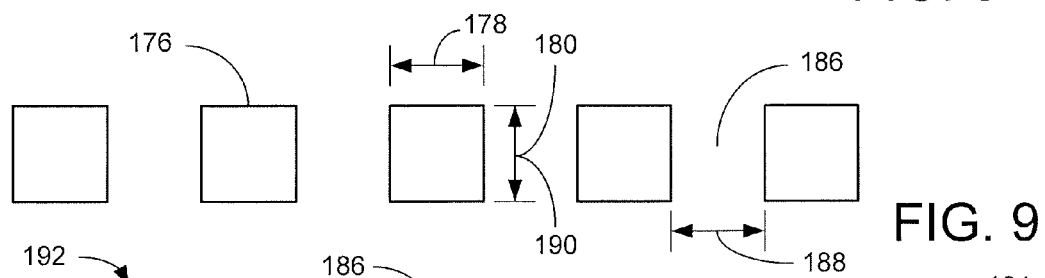
FIG. 9 shows another alternative window arrangement for the layers from FIG. 4.

FIG. 9 shows another alternative arrangement of the windows 176 in the ground layers 148, 152 from FIG. 4. The windows 176 can be a special form of rectangle known as the square in which the length 178 and the width 180 are substantially equal. In addition, the crossing member 186 may have the length 188 substantially equal to the length 178 of the window 176, and the crossing number 186 may have the width 190 substantially equal to the width 180 of the window 176. The relationship between the length and the width of the rectangular windows 176 and the length 188 and width 190 of the crossing member 186 may be adjusted to tune the impedance and environmental sensitivities.

Figure 10:
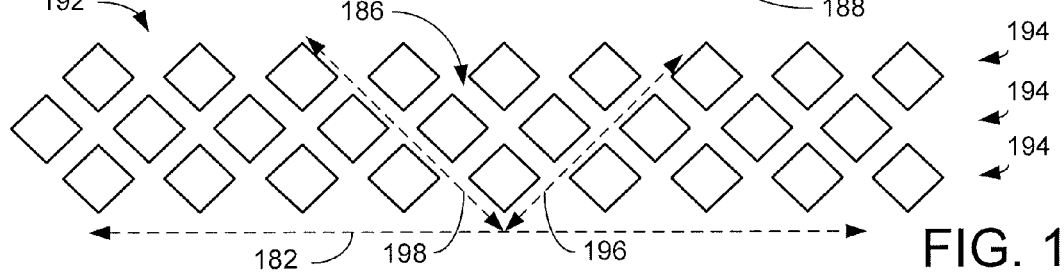
FIG. 10 is yet another alternative window arrangement for the layers from FIG. 4.

FIG. 10 demonstrates yet another alternative arrangement of the windows 176 on the ground layers 148, 152 from FIG. 4. A lattice pattern 192 is shown with multiple rows 194. The lattice pattern 192 can be achieved through the plurality of crossing members 186 being angled relative to the elongate axis 182. For example the first angle 196 can be approximately +45° relative to the elongate axis 182 and the second angle 198 can be approximately +135° relative to the elongate axis 182. Of course, other angular relationships between the crossing members 186 and the elongate axis 182 are possible. In addition, shapes other than diamond can be used in the lattice pattern 192.

Figure 11:
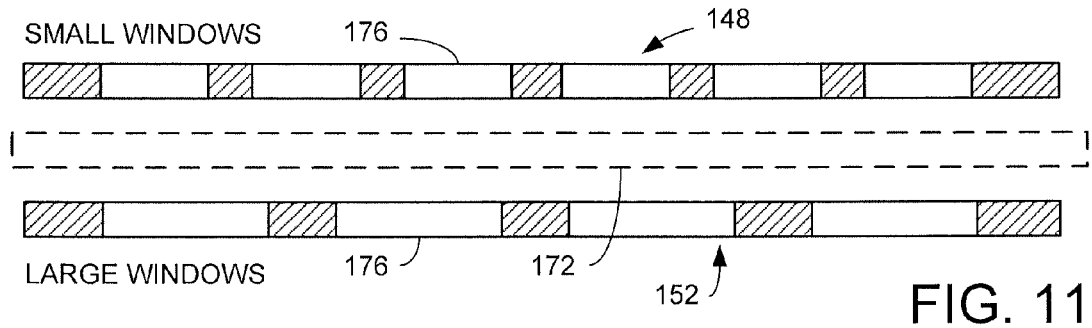
FIG. 11 is a side elevational view of the layers from FIG. 4 in accordance with other embodiments.

FIG. 11 demonstrates a side elevational view of the top ground layer 148, the elongated conductor 172, and the bottom ground layer 152 from FIG. 4 with different size windows 176. The top ground layer 148 is shown having small windows 176, while the bottom ground layer 152 is shown having large windows 176. Of course, the arrangement could be reversed with the bottom ground layer 152 having smaller windows 176, and the top ground layer 148 having larger windows 176. Again, the windows 176 are adjusted to attain the target impedance and to address environmental susceptibility or sensitivities. Therefore, putting the larger or smaller windows 176 towards the lower surface 138 of the housing 134 may be used to adjust the target impedance and environmental susceptibility, as seen in FIG. 3. The housing 134 typically includes metal that can affect the impedance and environmental susceptibility.

Figure 12:
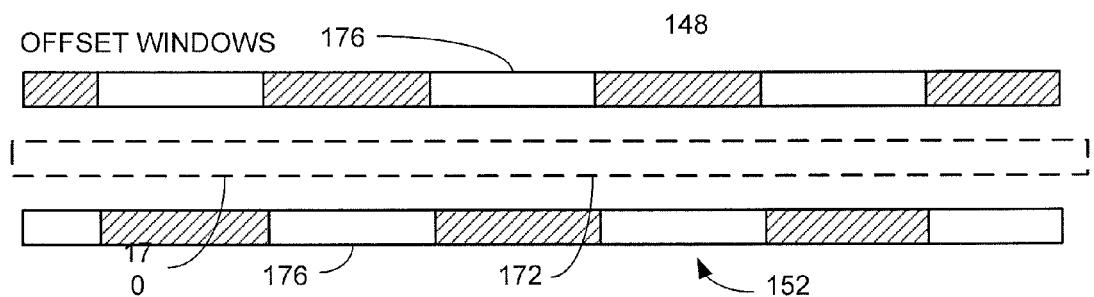
FIG. 12 is a side elevational view of the layers from FIG. 4 in accordance with further embodiments.

FIG. 12 shows a side elevational view of the top ground layer 148, the elongated conductor 172, and the bottom ground layer 152 from FIG. 4 with offset windows 176. In this arrangement, the windows 176 are offset, such that at least one side of the pair of conductor traces 170 is covered by metal as viewed from orthogonal to the elongated conductor 172. Again, the windows 176 can be adjusted to tune for the target impedance and to attain desirable environmental susceptibility.

Figure 13:
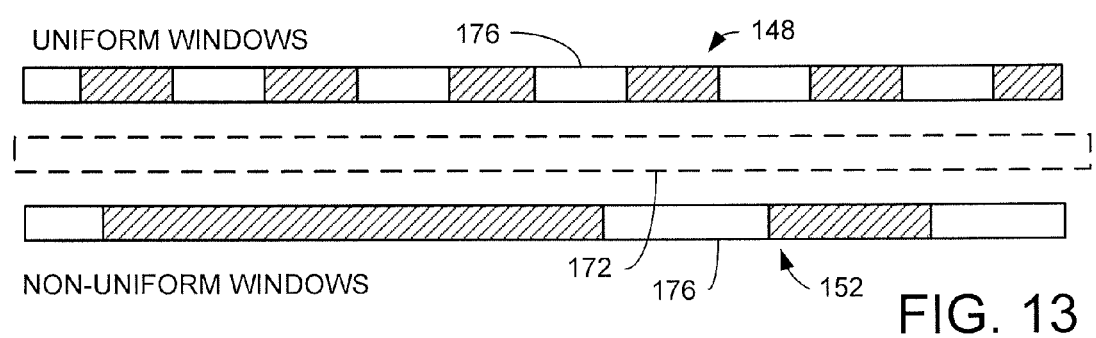
FIG. 13 is a side elevational view of the layers from FIG. 4 in accordance with further embodiments.

FIG. 13 shows a side elevational view of the top ground layer 148, the elongated conductor 172, and the bottom ground layer 152 from FIG. 4 with windows 176 of the uniform and non-uniform sizes. The windows 176 may be the same size in the top ground layer 148 or bottom ground layer 152, as demonstrated in the top ground layer 148 of FIG. 13. Alternatively, the windows 176 may be different sizes in the top ground layer 148 or the bottom ground layer 152, as demonstrated in the bottom ground layer of FIG. 13. As before, the windows 176 can be adjusted to tune for the target impedance and to attain desirable environmental susceptibility.

Figure 14:
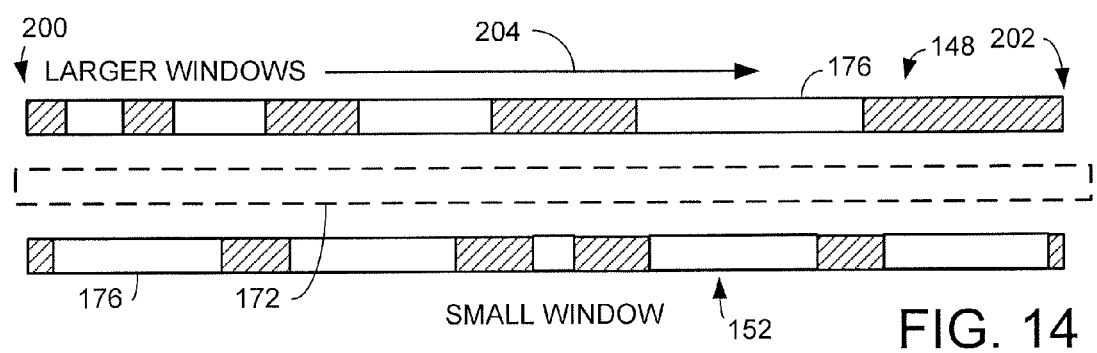
FIG. 14 is a side elevational view of the layers from FIG. 4 in accordance with further embodiments.

FIG. 14 shows a side elevational view of the top ground layer 148, the elongated conductor 172, and the bottom ground layer 152 from FIG. 4 with windows 176 that change in size from a first end 200 to a second end 202 of the top ground layer 148. As shown, the dimensions of the long axis of the windows 176 and of the length of the crossing members 186 both increase in the direction of the arrow 204. It is contemplated that the long axis of the windows 176 may increase in size in a first direction and the length of the crossing members 186 may decrease in size in the first direction. Another way of stating that might be the long axis of the windows 176 may increase in size in a first direction and the length of the crossing members 186 may increase in size in a second opposing direction.

The bottom ground layer 152 demonstrates a small window 176 towards the middle of the bottom ground layer 152 with larger windows 176 on either side towards the distal ends.

Of course, the various patterns or arrangements of windows 176 and the various shapes of the windows 176 can be mixed in order to attain the impedance requirements and the environmental susceptibility requirements.

It is to be understood that even though numerous characteristics and advantages of various embodiments of the present disclosure have been set forth in the foregoing description, together with details of the structure and function of various embodiments disclosed, this detailed description is illustrative only, and changes may be made in detail, especially in matters of structure and arrangements of parts within the principles of the present disclosure to the full extent indicated by the broad general meaning of the terms in which the appended claims are expressed.

What is claimed is:

1. An apparatus comprising:
a rigid multi-layer printed circuit board (PCB) comprising an embedded elongated conductor between opposing first and second reference planes, the first and second reference planes formed of conductive material electrically isolated from the embedded elongated conductor by intervening insulative material and each having a plurality of spaced apart windows extending therethrough and aligned with the embedded elongated conductor, the plurality of spaced apart windows in the first and second reference planes respectively arranged in different first and second patterns extending along an elongated axis of the embedded elongated conductor.

2. The apparatus of claim 1, wherein the plurality of spaced apart windows have a substantially rectangular shape.

3. The apparatus of claim 2, wherein each window in the plurality of spaced apart windows has a length dimension substantially parallel to the elongate axis of the embedded elongated conductor and a width dimension substantially orthogonal to the elongate axis of the embedded elongated conductor, and the length dimension is greater than the width dimension.

4. The apparatus of claim 1, wherein the plurality of spaced apart windows have a substantially square shape.

5. The apparatus of claim 1, wherein the plurality of spaced apart windows have a substantially circular shape.

6. The apparatus of claim 1, wherein plurality of spaced apart windows do not contain solid dielectric material.

7. The apparatus of claim 1, wherein the embedded elongated conductor is a pair of differential signal paths.

8. The apparatus of claim 1, when the embedded elongated conductor is adapted for transmission of a serial ATA (SATA) signal.

9. The apparatus of claim 1, when the embedded elongated conductor is adapted for transmission of a serial SCSI (SAS) signal.

10. The apparatus of claim 1, further comprising:
a controller attached to the PCB;
an interface circuit (I/F) attached to the PCB, the I/F configured to communicate with a host device;
a data buffer coupled to the I/F configured to temporarily store data pending transfer between the host device and a storage media;
a write channel configured to encode input write data from the host device to store data on the storage media;
a read channel configured to recover the stored data from the storage media; and
a servo control circuit configured to provide a positional control signal to position a read element and a write element adjacent the storage media.

11. An apparatus comprising:
a data storage device comprising a housing; and
a rigid multi-layer printed circuit board (PCB) comprising an embedded elongated conductor between opposing first and second reference planes, the first and second reference planes formed of conductive material electrically isolated from the embedded elongated conductor by intervening insulative material and each having a plurality of spaced apart windows extending therethrough and aligned with the embedded elongated conductor, the plurality of spaced apart windows in the first and second reference planes respectively arranged in different first and second patterns each extending along an elongated axis of the embedded elongated conductor, the second pattern positioned between the embedded elongated conductor and a surface of the housing, each window of the plurality of spaced apart windows in the second pattern having a first width greater than a second width of the embedded elongated conductor, the second width of the elongated conductor being orthogonal to a signal path of the embedded elongated conductor.

12. The apparatus of claim 11, wherein each of the plurality of spaced apart windows has a length greater than the first width of each of the plurality of spaced apart windows, the length being parallel to the signal path of the embedded elongated conductor.

13. The apparatus of claim 12, when the embedded elongated conductor is adapted for transmission of a serial ATA (SATA) signal.

14. The apparatus of claim 12, when the embedded elongated conductor is adapted for transmission of a serial SCSI (SAS) signal.

15. The apparatus of claim 12, further comprising:
a set of electronic components attached to the PCB to form a printed circuit board assembly.

16. An apparatus comprising:
a data storage device comprising a housing; and
a rigid multi-layer printed circuit board (PCB) comprising an embedded elongated conductor between opposing first and second reference planes, the first and second reference planes formed of conductive material electrically isolated from the embedded elongated conductor by intervening insulative material and each having a plurality of spaced apart windows extending therethrough and aligned with the embedded elongated conductor, the plurality of spaced apart windows in the first and second reference planes respectively arranged in different first and second patterns extending along an elongated axis of the embedded elongated conductor, the second pattern positioned between the embedded elongated conductor and a surface of the housing, the windows of the plurality of spaced apart windows in the second pattern being larger than windows of the plurality of spaced apart windows in the first pattern plane.

17. The apparatus of claim 16, wherein each window of the plurality of spaced apart windows in the first pattern is smaller than each window of the plurality of spaced apart windows in the second pattern.

18. The apparatus of claim 16, wherein the plurality of spaced apart windows of the first pattern are uniform in size and the plurality of spaced apart windows of the second pattern are non-uniform in size.

19. The apparatus of claim 16, wherein the plurality of spaced apart windows of the first pattern increase in size continuously in a first direction that is parallel to an elongate axis of the embedded elongated conductor.

20. The apparatus of claim 16, wherein the plurality of spaced apart windows of the first pattern has a small window in a median portion of the first reference plane and a larger window in relation to the small window towards a distal portion of the first reference plane.

* * * * *